United States Patent [19]

Vladimirsky et al.

[11] Patent Number: 6,093,520

[45] Date of Patent: Jul. 25, 2000

[54] HIGH ASPECT RATIO MICROSTRUCTURES AND METHODS FOR MANUFACTURING MICROSTRUCTURES

[75] Inventors: Yuli Vladimirsky; Olga Vladimirsky; Volker Saile, all of Baton Rouge, La.

[73] Assignee: Board of Supervisors of Louisiana State University and Agricultural and Mechanical College, Baton Rouge, La.

[21] Appl. No.: 08/295,898

[22] PCT Filed: Sep. 9, 1994

[86] PCT No.: PCT/US94/10164

§ 371 Date: Jul. 18, 1996

§ 102(e) Date: Jul. 18, 1996

[87] PCT Pub. No.: WO96/07954

PCT Pub. Date: Mar. 14, 1996

[51] Int. Cl.[7] .......................................... G03C 5/00
[52] U.S. Cl. ................ 430/326; 430/396; 430/942; 430/966; 430/967; 430/325
[58] Field of Search .................... 430/311, 325, 430/326, 396, 397, 942, 966, 967

[56] References Cited

U.S. PATENT DOCUMENTS

| | | | |
|---|---|---|---|
| 4,165,395 | 8/1979 | Chang | 427/43 |
| 5,334,467 | 8/1994 | Cronin et al. | 430/5 |
| 5,468,595 | 11/1995 | Livesay | 430/325 |

(List continued on next page.)

FOREIGN PATENT DOCUMENTS

| | | | |
|---|---|---|---|
| 0363547A1 | 4/1990 | European Pat. Off. | H01L 21/306 |
| 0599539A2 | 6/1994 | European Pat. Off. | G03F 7/075 |
| 0599539A3 | 6/1994 | European Pat. Off. | G03F 7/075 |

(List continued on next page.)

OTHER PUBLICATIONS

Liu, H. I., et al., "Self–limiting Oxidation for Fabricating sub–5 nm Silicon Nanowires," *Appl. Phys. Lett.* (*USA*), vol. 64, pp. 1383–1385 (1994) (abstract) only.

(List continued on next page.)

*Primary Examiner*—Maria Nuzzolillo
*Assistant Examiner*—Laura Weiner
*Attorney, Agent, or Firm*—John H. Runnels

[57] ABSTRACT

A method is disclosed for the manufacture of microstructures and devices. The method is relatively easy to implement, and has the capability to produce features having a resolution of ten microns or smaller with a high aspect ratio (60, 75, 100, 200, or even higher). A master mask, appropriately designed and fabricated, is used in an initial exposure step with visible light, ultraviolet light, x-rays, an electron beam, or an ion beam to make a "transfer mask" directly on the surface of the sample. It is not necessary to produce an expensive x-ray master mask, even if x-ray exposure of the sample is desired. There is no necessity for gap control during exposure of the resist through the transfer mask. The resulting structures may, if desired, have a higher aspect ratio than microstructures that have previously been produced through other methods. The "transfer mask" is not a unit separate from the sample, but is formed directly on the surface of each sample. A conventional-type master mask is used to form the "transfer mask" with visible light, ultraviolet light, x-rays, an electron beam, or an ion beam. The total cost is determined primarily by the cost of the master mask. Because the master mask can be a conventional-type optical mask, the high cost of producing a conventional x-ray mask can be avoided. The "master mask" is used to form a "transfer mask" on each sample individually. The patterned transfer mask comprises a thin layer of an absorber of the radiation to be used in the final exposure. For example, if the final exposure is to be performed with soft x-rays, the transfer mask may be formed from an x-ray absorber such as a patterned layer of gold. The transfer mask is then used in one or more separate exposures of the underlying resist. An analogous method may be used for radiation-assisted chemistry, such as etching or deposition, on the surface of a sample.

21 Claims, 2 Drawing Sheets

U.S. PATENT DOCUMENTS

| | | | |
|---|---|---|---|
| 5,512,395 | 4/1996 | Rostoker et al. | 430/324 |
| 5,554,484 | 9/1996 | Rostoker et al. | 430/270.1 |
| 5,591,564 | 1/1997 | Rostoker et al. | 430/311 |
| 5,624,791 | 4/1997 | Kawabata et al. | 430/325 |

FOREIGN PATENT DOCUMENTS

| | | | |
|---|---|---|---|
| 1-140722 | 6/1989 | Japan | 430/328 |
| 8706029 | 10/1987 | WIPO | G03F 7/02 |

OTHER PUBLICATIONS

"LIGA—Movable Microstructures," Kernforschungszentrum Karslruhe (1993?).

J. Mohr et al., "Herstellung von beweglichen Mikrostrukturen mit dem LIGA–Verfahren," *KfK Nachrichten,* Jahrgang 23, 2–3/91, pp. 110–117 (1991) (not in english).

E. Spiller et al., "X–Ray Lithography," Research Report, I.B.M. T.J. Watson Research Center (1977).

HIGH ASPECT RATIO MICROSTRUCTURES AND METHODS FOR MANUFACTURING MICROSTRUCTURES

TECHNICAL FIELD

This invention pertains to microscopic machines, structures, and devices, particularly to microscopic machines, structures, and devices having a high aspect ratio, and to methods of making such machines, structures, and devices.

BACKGROUND ART

Microscopic machines, structures, devices, and integrated circuits (hereafter collectively called "microstructures" for simplicity) have wide application. Integrated circuits are used in devices too numerous to be recited. Microstructures other than integrated circuits, whose dimensions are typically on the order of several hundred microns down to one micron, or even into the submicron range, also have a wide range of applications. They have been used in micromechanics, microoptics, integrated optics, sensors, actuators, and chemical engineering. Microstructures that have been built include such structures as gears, nozzles, chromatographic columns, acceleration sensors, microturbines, micromotors, and linear actuators.

Microstructures are usually manufactured through a lithography process. In lithography, one or more "masks" are initially prepared, each mask incorporating all or part of the pattern to be formed on a sample surface. Transparent and opaque areas of the mask represent the desired pattern. Radiation, such as visible light, ultraviolet light, x-rays, an electron beam, or an ion beam, is transmitted through the mask onto a resist. After exposure, the resist (which may have either a positive tone or a negative tone) is developed to form the pattern on the sample surface.

To support the opaque portions of the pattern in the mask, a substrate or carrier is used that is reasonably transparent to radiation at the wavelength used for the exposure. For lithography in visible or ultraviolet wavelengths, glass has typically been used as the carrier. For x-ray masks, carriers have typically been expensive membranes a few microns thick, usually made of a low-Z ("Z"=atomic number) material such as silicon, beryllium, titanium, aluminum, silicon nitride, or graphite.

In making an integrated circuit, it is usually desirable to have the "depth" of a feature (i.e., the dimension in the direction normal to the surface of the pattern) be relatively small. By contrast, in making microstructures other than integrated circuits, it is often desirable to have the "depth" of the feature be relatively large (i.e., deep-etch lithography), to impart a three-dimensional structure to the microstructure, or a reasonable degree of strength to the microstructure, or both.

The resolution of a microstructure is the dimension, in a direction parallel to the structure's surface, of the smallest reproducible feature, or the smallest reproducible gap between adjacent features. The "aspect ratio" of a microstructure is the ratio of the depth of a feature to the resolution. To the inventors' knowledge, an aspect ratio of about 50 is the highest aspect ratio that has previously actually been achieved for any microstructure having a resolution of 10 microns or smaller.

Three methods of imaging have previously been used in lithography. In proximity imaging, the mask is positioned a small but finite distance (or gap) from the sample surface. Proximity imaging is predominantly used in x-ray lithography.

In projection imaging, a projection lens is placed between the mask and the sample to focus light onto the sample surface. (Alternatively, a condenser lens may be placed before the mask.) Projection imaging is predominantly used in visible and ultraviolet optical lithography.

In contact (or zero-gap) printing, the mask is placed directly on (but not adhered to) the sample surface. Contact printing is rarely used in lithography. In x-ray lithography, contact printing can result in serious contamination problems for the sample, and in degraded integrity for the mask. In optical lithography, contact printing can result in deterioration of the image from uncontrolled multiple reflections and light interferences between the mask and the sample surface.

Producing masks for lithographic applications can be expensive. X-ray masks are particularly expensive, typically costing about three to five times as much as an optical mask. The cost of mask production has two principal components: the cost of the substrate, and the cost of pattern formation. For a master mask having a moderate-density pattern, these two cost components are often roughly equal. But for a high-density pattern, such as is typical of a mask for an integrated circuit, the cost to produce the pattern can be many times higher than the cost of the substrate. On the other hand, for masks used in x-ray micromachining, the cost of the substrate is typically higher. In the latter case, the substrate provides the rigidity and integrity needed by the mask, which is subjected to the heavy impact of high doses of ionizing radiation.

"LIGA—Movable Microstructures," Kernforschungszentrum Karslruhe (1993?) reported the manufacture of an acceleration sensor having a height of 100 microns, a cantilever 10 microns wide, and slit width of 4 microns, i.e., an aspect ratio of 25. See the left-hand column of page 8 of that publication.

J. Mohr et al., "Herstellung von beweglichen Mikrostrukturen mit dem LIGA-Verfahren," KfK Nachrichten, Jahrgang 23, 2–3/91, pp. 110–117 (1991) reported the manufacture of a structure having a gap width of 3 microns, and a depth of 150 microns, i.e., an aspect ratio of 50. See FIG. 6 of Mohr et al.

E. Spiller et al., "X-Ray Lithography," Research Report, I.B.M. T. J. Watson Research Center (1977) disclosed a technique for x-ray microscopy of biological objects in which a specimen is brought in close contact with the resist surface, either mounted on a thin substrate, a grid, or directly on top of the resist layer. After development a relief structure is obtained in which the heights of a feature in the resist correspond to the x-ray absorption of the specimen. A scanning electron microscope was used to produce a magnified picture of the resist relief image. See pp. 48–49 and FIGS. 3.28 and 3.29 of Spiller et al.

DISCLOSURE OF THE INVENTION

A novel method has been discovered for the manufacture of microstructures. The novel method is relatively easy to implement, and has the capability to produce features having a resolution of ten microns or smaller with a high aspect ratio (60, 75, 100, 200, or even higher). A master mask, appropriately designed and fabricated, is used in an initial exposure step with visible light, ultraviolet light, x-rays, an electron beam, or an ion beam to make a novel "transfer mask" directly on the surface of the sample. It is not necessary to produce an expensive x-ray master mask, even if x-ray exposure of the sample is desired. There is no necessity for gap control during exposure of the resist through the transfer mask. The resulting structures may, if desired, have a higher aspect ratio than microstructures that have previously been produced through other methods.

Briefly, the "transfer mask" used in the novel method is not a unit separate from the sample, but is formed directly on the surface of each sample. A conventional-type master mask is used to form the "transfer mask" with visible light, ultraviolet light, x-rays, an electron beam, or an ion beam. The total cost is determined primarily by the cost of the master mask. Because the master mask can be a conventional-type optical mask, the high cost of producing a conventional x-ray mask can be avoided.

The "master mask" is used to form a "transfer mask" on each sample individually. The patterned transfer mask comprises a thin layer of an absorber of the radiation to be used in the final exposure. For example, if the final exposure is to be performed with soft x-rays, the transfer mask may be formed from an x-ray absorber such as a patterned 3-micron layer of gold. The transfer mask is then used in one or more separate exposures of the underlying resist.

Using soft x-rays with a wavelength around 1 nm, such a transfer mask has been used to form high resolution features more than 200 microns deep, but having a gap width as fine as 2 micron, i.e., an aspect ratio of 100. Seven stages of exposure and development were used to create these features, each stage adding a depth of about 30 microns. If desired, additional stages of exposure and development would allow the formation of features having a depth up to 500 microns, or even deeper. (By contrast, a depth of only about 2 microns is possible with optical lithography.) If desired, different exposure steps could be even performed with different wavelengths of incident radiation.

The resolution may be made substantially finer than 2 microns if desired—1 micron, 0.5 micron, 0.2 micron, 0.1 micron, or even smaller, depending primarily on the resolution of the transfer mask. A resolution of 2 microns has been demonstrated to date, simply because that was the resolution of a readily available master mask. A master mask with finer resolution (which may readily be made through means known in the art) would result in a transfer mask, and therefore a microstructure, having finer resolution.

With a 0.1 micron resolution (in a transfer mask generated, for example, with an e-beam), the feature depth could be as great as 30 to 50 microns before being limited by diffraction, i.e., an aspect ratio of 300 to 500.

Because the transfer mask is attached to the resist, there is no need to align the transfer mask and the surface, nor is there any need for gap control between the transfer mask and the surface. Because there is zero gap between the transfer mask and the sample, feature resolution close to the theoretical limit for a given wavelength of radiation may be achieved, minimizing the diffraction and blurring that a gap inevitably introduces. Multiple stepwise exposure and development, as previously discussed, can also help reduce the effects of diffraction. The resist underlying the absorber (see, e.g., FIG. 1(i)), helps absorb diffracted radiation, reducing its impact.

The transfer mask approach optionally permits the use of new lithography techniques, such as in situ development (simultaneous exposure and development), or radiation-assisted chemistry (either etching or deposition). In a conventional mask, the presence of a mask substrate would interfere with in situ development. Similarly, the presence of a mask substrate is incompatible with radiation-assisted chemistry, because of the physical obstacle that the substrate imposes.

In situ development is that which occurs simultaneously as exposure occurs, without the necessity of a separate development step. An example of a prototype of an in situ development process is the "sublimation" of polymethylmethacrylate ("PMMA") from the surface when PMMA is exposed to high doses of x-rays or ultraviolet light in vacuum, or where PMMA is exposed to x-rays or ultraviolet light in the presence of oxygen.

In radiation-assisted chemistry, a material other than a resist is etched or deposited in a manner somewhat similar to reactive ion etching (RIE). In reactive ion etching, a radio-frequency is used to excite a gas to a plasma state; and the resulting ions in the plasma then etch a surface. In radiation-assisted etching, a gas is ionized in the vicinity of the site of radiation exposure, leading to etching directly on the surface, without the use of a resist. Examples are the etching of a silicon surface, or of a gallium arsenide surface, with a gas comprising a chlorocarbon, a chlorofluorocarbon, oxygen, chlorine, or fluorine.

Forming a transfer mask directly on the sample opens new possibilities that are not available with conventional masks, for example, exposure of samples with curved surfaces, dynamic deformation of the sample surface during exposure, and rotation of the sample during exposure. One application of such techniques is the creation of three-dimensional structures whose cross-section can vary as a function of depth.

BEST MODE FOR CARRYING OUT THE INVENTION

Fabrication of the master mask may be performed through known methods for preparing an optical, ultraviolet, x-ray, e-beam, or ion-beam mask. The master mask is then used to prepare the transfer mask using standard lithography techniques. Depending on the resolution required, the transfer mask may be fabricated from the master mask with optical, ultraviolet, x-ray, e-beam, or ion-beam lithography techniques.

The transfer mask comprises an absorber pattern formed directly on the surface of the resist layer of the sample to be patterned. The transfer mask is used in subsequent steps to form the pattern in the sample. Either an additive or a subtractive method may be used.

Formation of the Transfer Mask—Additive Method

Figure 1A:
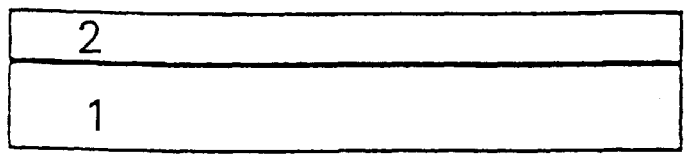
FIGS. 1(a) through 1(j) illustrate a process of making a microstructure in accordance with the present invention.
Figure 1B:
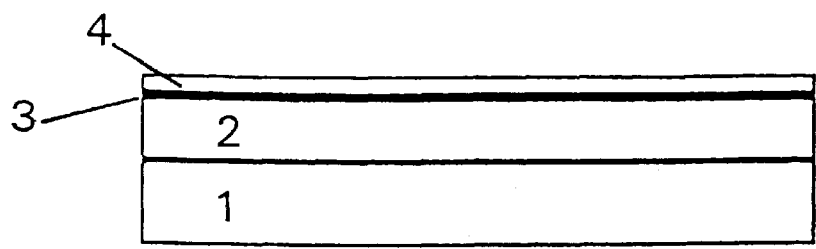

As illustrated in FIGS. 1(a) and 1(b), a three-layer starting material lying atop a substrate 1 may be used. Layer 2, immediately adjacent substrate 1, is the sample resist, which can be any one of many known resists, such as PMMA or an AZ-type resist (available from Hoechst Celanese or from Shipley Co.). Layer 3, immediately adjacent layer 2, is the transfer mask plating base. Plating base 3 preferably comprises an electrical conductor, for example a 300–500 Å layer of gold. Layer 4, immediately adjacent to layer 3, comprises a resist of thickness sufficient to form the desired transfer mask absorber (for example, a 3 to 10 micron thickness of a commonly used AZ-type resist.)

Figure 1C:
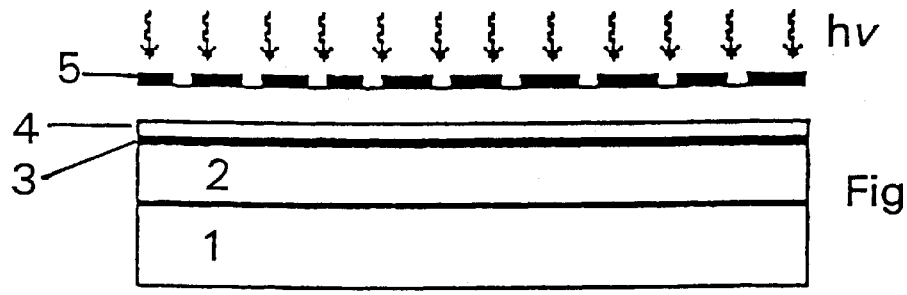
Figure 1D:
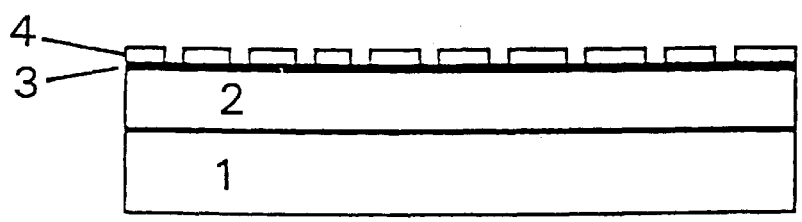
Figure 1E:
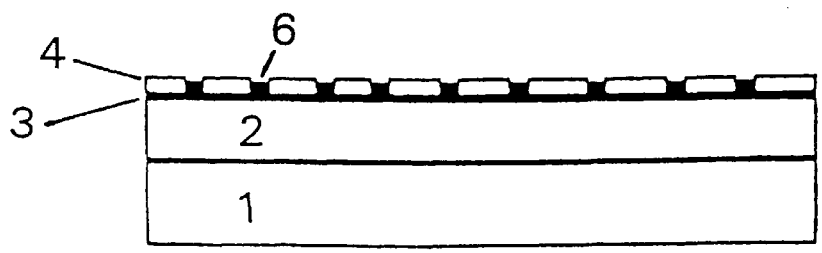
Figure 1F:
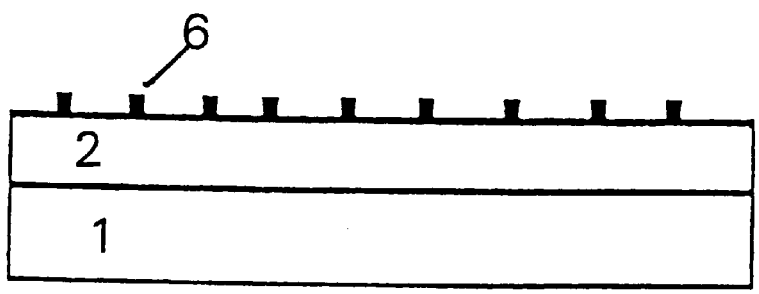
Figure 1G:
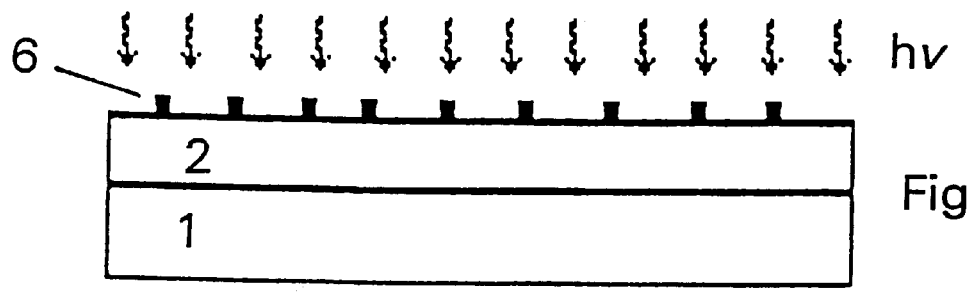
Figure 1H:
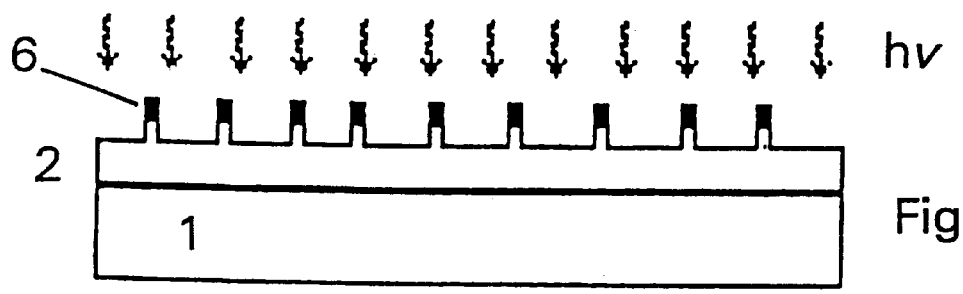
Figure 1I:
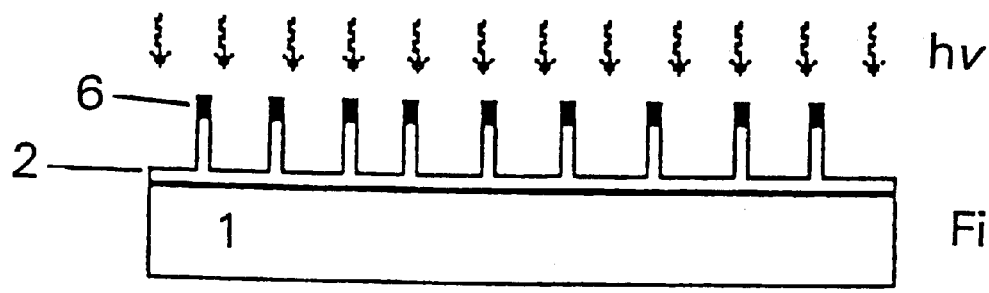
Figure 1J:
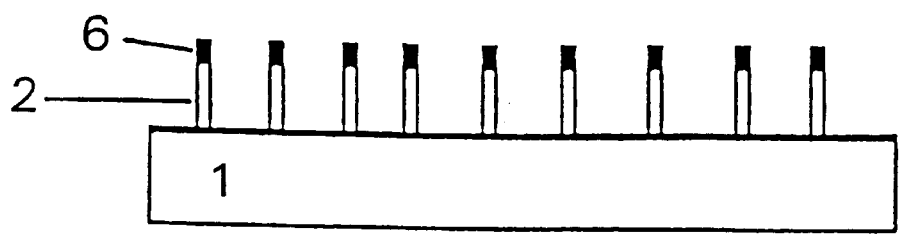

As shown in FIG. 1(c), transfer mask resist 4 is exposed through mask 5 with radiation (designated "hv"), which may be visible, ultraviolet, or x-ray radiation, or an e-beam or ion beam through master mask 5. For example, this step may comprise proximity printing with an optical master mask. Alternatively, the transfer mask resist may be exposed directly with an e-beam writer (not illustrated). Transfer mask resist 4 is then developed (FIG. 1(*d*)), and transfer mask absorber 6 is then formed (FIG. 1(*e*)), for example by electroplating a 3 to 8 micron layer of gold onto plating base 3, in the areas of transfer mask resist 4 that are removed during development. (The transfer mask thickness is that which is appropriate for the amount of radiation to be used to expose the sample resist to a given depth during one exposure step. Depending on the intended application, the transfer mask absorber might, for example, have a thickness between 0.5 micron and 50 microns.) Although gold is the preferred material for absorber layer 6 in this additive method, other absorbers such as nickel or copper could also be used.

Then the remaining transfer mask resist is removed (FIG. 1(*f*)), for example by blanket exposure and development of the remaining resist. Transfer mask plating base 3 is removed from areas not corresponding to the transfer mask pattern, preferably by dry etching in an anisotropic mode that will etch preferentially in a direction normal to the surface, for example by argon ion milling. Alternatively, wet etching with an appropriate solvent may be used; for example, a solution of $I_2$ in aqueous potassium iodide will remove gold at a controllable rate (e.g., 0.1 to 1.0 micron per minute, depending on concentration and temperature).

Formation of the Transfer Mask—Subtractive Method (Not Illustrated)

In some applications, it may be desirable to form a transfer mask having a reversed, or negative, tone. The transfer mask absorber layer, for example a few micron thickness of tungsten, is applied to the sample to be patterned, for example by chemical vapor deposition. Then a resist is applied of sufficient thickness (e.g., a 1–2 micron AZ type resist) to form a transfer mask absorber having appropriate thickness. The transfer mask resist is exposed through the master mask, followed by development of the transfer mask resist. The transfer mask is then formed by dry etching, wet etching, or reactive ion etching through the developed portions of the transfer mask resist. Although tungsten is the preferred material for the absorber layer in the subtractive method, other absorbers such as gold, nickel, or copper could also be used.

Patterning with the Transfer Mask

The layer underlying the transfer mask may be a resist, such as PMMA, AZ, or alternatively it could be another material that can be processed with radiation-assisted chemistry, such as $SiO_2$.

Sample resist 2 (with adhering transfer mask 6) is exposed to radiation of a chosen wavelength—visible, ultraviolet, or x-ray—or to an electron beam or ion beam if desired (FIG. 1(*g*)). For many applications, collimated x-rays (e.g., x-rays from a synchrotron) will be the preferred radiation source.

There are many possible ways to expose the sample with its adhered transfer mask. Exposure may be stationary. The exposure may be performed during scanning of either the radiation source or the sample. The angle of exposure may be normal to the surface, or any other incident angle desired. The angle of exposure may be constant, or variable, including rotation or wobbling. The surface of the sample may be flat or curved. If a curved surface is desired, the curvature is preferably applied after the transfer mask has been formed on the sample; in such a case, it may be appropriate to distort the pattern on the master mask in such a way that the transfer mask can be printed flat, but will result in the desired pattern on the surface after the surface has been curved into the desired shape. The surface shape may remain constant during exposure, or it may even be changed dynamically during exposure.

Development of the resist (either wet or dry development) may follow exposure as an independent step. Alternatively, in situ development (simultaneous exposure and development) can occur in an appropriate atmosphere (vacuum or gas mixture).

In an alternative embodiment, radiation-assisted chemical processing can be used in chemical etching of the sample, or chemical deposition onto the sample.

The sample may be exposed in a single step, or in a series of multiple steps with intervening development steps (FIGS. 1(*g*)–(*j*)). Using multiple steps can permit the creation of features having a greater depth than can be achieved in a single, one-step exposure. Because transfer mask 6 adheres to sample resist 2, the transfer mask is self-aligning, meaning that there is no need to maintain alignment of the mask and sample between exposure steps.

Either positive or negative tone patterns on the transfer mask may be used in one-step processing. However, positive tones are preferred for multiple-step processing. With a negative tone, it will generally be desirable to remove the transfer mask by dry or wet etching before development.

Graded tone patterns may also be used, and are suitable for differentially shaping the resist in a direction normal to its surface—for example, a hemispherical feature or other three-dimensional feature could be made with graded toning.

After development, the transfer mask may be removed (if desired) by dry or wet etching. Dry etching removal, for example, may be performed by argon ion milling. Wet etching removal of gold, for example, may be performed with a solvent such as a solution of $I_2$ in aqueous KI.

FIGS. 2, 3, and 4 (which are not reproduced here, but which may be seen in the published international application, WO 9/07954, international publication date Mar. 14, 1996) are electron micrographs illustrating a resist pattern of a microstructure that has been manufactured in accordance with the present invention. (Scale bars are included in each photograph.) A self-supporting 1.5 mm thick PMMA resist sheet was patterned to a depth of slightly over 200 microns, with a minimum gap of 2 microns. FIG. 2 is an overview of the entire test pattern, which was chosen to represent a typical micromechanical structure. FIG. 3 is an enlarged view of the far left "spoke" of this pattern. FIG. 4 is a further enlargement of the top of the spoke illustrated in FIG. 3.

The transfer mask plating base was prepared by evaporating onto the resist 70 Å of chromium (as an adhesion promoter), followed by 500 Å of gold, using an electron beam evaporator. A transfer mask resist comprising a 3 micron-thick layer of standard novolak-based AZ-type resist S1400-37 (Shipley Co.) was formed on the plating base by spinning.

The resist was then exposed with ultraviolet light through an optical mask in proximity mode with a gap of 12 microns. After exposure, the resist was developed with a standard developer, Microposit 454 (Shipley Co.). Exposure and development were performed following the manufacturer's recommended procedures.

After development, the transfer mask was formed by electroplating a 3 micron layer of gold onto the plating base, using a standard gold electroplating solution (Enthone-OMI Co.). The transfer mask resist was then removed by blanket exposure and subsequent development. The exposed plating base was then etched for 20–30 seconds with a solution of KI (5% by weight) and $I_2$ (1.25% by weight) in water. The chromium layer was removed by etching in a standard chromium etch (KTI Co.).

X-ray exposures were made with the x-ray lithography beam line at the J. Bennett Johnston Sr. Center for Advanced Microstructures and Devices, Louisiana State University, Baton Rouge, La. The beamline was equipped with two grazing-incidence (1.5°) flat mirrors, and provided collimated soft x-ray radiation with a wavelength of 7–11 Å, optimized for microcircuit fabrication. The PMMA resist was patterned stepwise through the transfer mask. Each step comprised an both exposure and subsequent development. The exposure dose was 8 to 12 J/cm². A five minute development removed 30 microns of exposed PMMA. Development was performed in a standard developer, namely that of W. Ehrfield et al., "Progress in Deep-Etch Synchrotron Radiation Lithography," *J. Vac. Sci. Tech.*, vol. B 6, No. 1, pp. 178–182 (1988). The exposure/development cycle was repeated seven times. The seven-step process resulted in a pattern a little over 200 microns deep. The finest features (gaps) were 2 microns wide, corresponding to an aspect ratio of 100. See FIGS. 2, 3, and 4.

Miscellaneous

As used in the claims, the term "radiation" is intended to encompass a type of radiation to which a resist (or other material in a sample) is sensitive. For example, unless the context indicates otherwise, "radiation" could comprise visible light, ultraviolet light, soft x-rays, hard x-rays, an electron beam, or an ion beam.

The entire disclosures of all references cited in this specification are hereby incorporated by reference in their entirety. In the event of an otherwise irresolvable conflict, the present specification shall control over a document incorporated by reference.

What is claimed is:

1. A method for fabricating a selected pattern at least 6 microns thick in a resist at least 6 microns thick; wherein the pattern comprises at least one feature having a resolution of 10 microns or smaller and having an aspect ratio of 60 or greater; and wherein said method comprises the steps of:
   (a) forming a transfer mask lithographically, wherein the transfer mask adheres to the surface of the resist, wherein the transfer mask comprises portions that correspond to the pattern and that are opaque to radiation to which the resist is sensitive, wherein the transfer mask comprises other portions that are transparent to radiation to which the resist is sensitive, wherein the opaque portions corresponding to the pattern have either a positive tone or a negative tone relative to the pattern, wherein the resist has a positive tone if the opaque portions of the pattern have a positive tone relative to the pattern, wherein the resist has a negative tone if the opaque portions of the pattern have a negative tone relative to the pattern;
   (b) exposing the resist and the transfer mask to radiation to which the resist is sensitive, whereby portions of the resist underlying the opaque portions of the transfer mask are not exposed to the radiation, and whereby portions of the resist underlying the transparent portions of the transfer mask are exposed to the radiation; and
   (c) developing the resist to selectively remove the radiation-exposed portions of the resist if the resist has a positive tone; or to selectively remove the unexposed portions of the resist if the resist has a negative tone; whereby the pattern is formed in the resist.

2. A method as recited in claim 1, wherein the resist has a positive tone, wherein the opaque portions of the pattern have a positive tone relative to the pattern, and wherein the opaque portions of the transfer mask comprise gold.

3. A method as recited in claim 1, wherein the resist has a negative tone, wherein the opaque portions of the pattern have a negative tone relative to the pattern, and wherein the opaque portions of the transfer mask comprise tungsten.

4. A method as recited in claim 1, wherein said exposing step and said developing step are each repeated a plurality of times, and wherein the transfer mask is in the same position relative to the resist during each of said exposing steps.

5. A method as recited in claim 1, wherein during said exposure step the position of the resist is scanned relative to the position of the radiation, or wherein during said exposure step the position of the radiation is scanned relative to the position of the resist.

6. A method as recited in claim 1, wherein during said exposure step the position of the resist is rotated relative to the position of the radiation, or wherein during said exposure step the position of the radiation is rotated relative to the position of the resist.

7. A method as recited in claim 1, wherein the transfer mask additionally comprises portions that are semi-opaque to radiation to which the resist is sensitive, whereby in said exposing step portions of the resist underlying the semi-opaque portions of the transfer mask are partially exposed to radiation; and whereby in said developing step the partially-exposed portions of the resist are removed to a lesser depth than the depth to which the fully-exposed portions of the resist are removed.

8. A method as recited in claim 1, wherein the radiation comprises x-rays.

9. A method as recited in claim 1, wherein the radiation comprises visible light.

10. A method as recited in claim 1, wherein the radiation comprises ultraviolet light.

11. A method as recited in claim 1, wherein the radiation comprises an electron beam.

12. A method as recited in claim 1, wherein the radiation comprises an ion beam.

13. A method as recited in claim 1, additionally comprising the step of removing the transfer mask after the pattern is formed in the resist.

14. A method as recited in claim 1, wherein the angle of incidence of the radiation on the surface of the transfer mask is 90°.

15. A method as recited in claim 1, wherein the angle of incidence of the radiation on the surface of the transfer mask is less than 90°.

16. A method as recited in claim 1, wherein the angle of incidence of the radiation on the surface of the transfer mask changes with time during said exposing step.

17. A method as recited in claim 1, wherein the surface of the transfer mask and the surface of the resist are not flat.

18. A method as recited in claim 1, wherein the shape of the transfer mask and the shape of the resist change with time during said exposing step.

19. A method as recited in claim 1, wherein the pattern fabricated in the resist comprises at least one feature having a resolution of 10 microns or smaller and having an aspect ratio of 60 or greater.

20. A method as recited in claim 1, wherein said exposing step and said developing step are each repeated a plurality of times; wherein the transfer mask is in the same position relative to the resist during each of said exposing steps; and wherein the angle of incidence of the radiation on the surface of the transfer mask changes between said exposing steps.

21. A method as recited in claim 1, wherein said exposing step and said developing step are each repeated a plurality of times, and wherein the shape of the transfer mask and the shape of the resist change between said exposing steps.

* * * * *